(12) United States Patent
Kitano et al.

(10) Patent No.: US 7,867,847 B2
(45) Date of Patent: Jan. 11, 2011

(54) METHOD OF MANUFACTURING DIELECTRIC FILM THAT HAS HAFNIUM-CONTAINING AND ALUMINUM-CONTAINING OXYNITRIDE

(75) Inventors: Naomu Kitano, Machida (JP); Takashi Nakagawa, Hachioji (JP); Toru Tatsumi, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 12/761,924

(22) Filed: Apr. 16, 2010

(65) Prior Publication Data

US 2010/0221885 A1 Sep. 2, 2010

Related U.S. Application Data

(63) Continuation of application No. PCT/JP2009/065306, filed on Sep. 2, 2009.

(30) Foreign Application Priority Data

Oct. 31, 2008 (JP) .............................. 2008-282163

(51) Int. Cl.
*H01L 21/473* (2006.01)
(52) U.S. Cl. ........................ 438/261; 438/287; 438/785; 257/E21.267
(58) Field of Classification Search .......... 257/E21.493, 257/E21.494
See application file for complete search history.

(56) References Cited

U.S. PATENT DOCUMENTS 6,903,398 B2 6/2005 Yamamoto .................. 257/295

(Continued)

FOREIGN PATENT DOCUMENTS

JP 2004-214304 7/2004

(Continued)

OTHER PUBLICATIONS

Sivasubramani, P., et al., "Effect of Composition on the Thermal Stability of Sputter Deposited Hafnium Aluminate and Nitrided Hafnium Aluminate Dielectrics on Si (100)," Journal of Applied Physics, vol. 101, No. 11, p. 114108 (2007).

(Continued)

*Primary Examiner*—Stephen W Smoot
(74) *Attorney, Agent, or Firm*—Fitzpatrick, Cella, Harper & Scinto

(57) ABSTRACT

The present invention provides a method of manufacturing a dielectric film having a high permittivity. An embodiment of the present invention is a method of manufacturing, on a substrate, a dielectric film including a metallic oxynitride containing an element A made of Hf or a mixture of Hf and Zr, an element B made of Al, and N and O. The manufacturing method includes: a step of forming a metallic oxynitride whose mole fractions of the element A, the element B, and N expressed as $B/(A+B+N)$ has a range of $0.015 \leq (B/A+B+N)) \leq 0.095$ and $N/(A+B+N)$ has a range of $0.045 \leq (N/(A+B+N))$ and a mole fraction $O/A$ of the element A and O has a range expressed as $1.0 < (O/A) < 2.0$, and having a noncrystalline structure; and a step of performing an annealing treatment at 700° C. or higher on the metallic oxynitride having a noncrystalline structure to form a metallic oxynitride including a crystalline phase with a cubical crystal incorporation percentage of 80% or higher.

9 Claims, 12 Drawing Sheets

U.S. PATENT DOCUMENTS

| | | | |
|---|---|---|---|
| 7,125,765 B2 | 10/2006 | Yamamoto | 438/240 |
| 7,307,303 B2 | 12/2007 | Yamamoto | 257/295 |
| 7,524,723 B2 | 4/2009 | Yamamoto | 438/240 |
| 7,547,952 B2 | 6/2009 | Metzner et al. | 257/411 |
| 7,605,436 B2 | 10/2009 | Yamaguchi | 257/410 |
| 2004/0198069 A1 | 10/2004 | Metzner et al. | 438/785 |
| 2005/0167768 A1 | 8/2005 | Yamaguchi | 257/410 |
| 2006/0071282 A1* | 4/2006 | Kadoshima et al. | 257/369 |
| 2007/0108538 A1* | 5/2007 | Koyama | 257/412 |
| 2007/0252232 A1 | 11/2007 | Ino et al. | 257/499 |
| 2008/0105918 A1* | 5/2008 | Jeon et al. | 257/324 |
| 2008/0169520 A1 | 7/2008 | Kiyomura et al. | 257/411 |
| 2008/0197429 A1 | 8/2008 | Sato et al. | 257/412 |
| 2008/0237688 A1 | 10/2008 | Yasuda | 257/316 |
| 2008/0264775 A1 | 10/2008 | Kitano et al. | 204/192.1 |
| 2009/0170340 A1 | 7/2009 | Kitagawa et al. | 438/766 |
| 2009/0170341 A1 | 7/2009 | Kitano et al. | 438/770 |
| 2009/0170344 A1 | 7/2009 | Fukuchi et al. | 438/785 |
| 2010/0120238 A1 | 5/2010 | Kitano et al. | 438/586 |
| 2010/0133092 A1 | 6/2010 | Mashimo et al. | 204/192.21 |
| 2010/0221905 A1* | 9/2010 | Hautala et al. | 438/591 |

FOREIGN PATENT DOCUMENTS

| | | |
|---|---|---|
| JP | 3748218 | 2/2006 |
| JP | 2006-135084 | 5/2006 |
| JP | 2007-067229 A | 3/2007 |
| JP | 3981094 | 9/2007 |
| JP | 2007-266376 A | 10/2007 |
| JP | 2007-288084 | 11/2007 |
| JP | 2007-299878 | 11/2007 |
| JP | 2008-198982 | 8/2008 |
| JP | 2008-205065 | 9/2008 |
| JP | 2008-244163 | 10/2008 |
| WO | WO 2004/084291 A | 9/2004 |
| WO | WO 2004/094691 A1 | 11/2004 |

OTHER PUBLICATIONS

Koyama, M., et al., "Effect of Film Composition of Nitrogen Incorporated Hafnium Aluminate (HfAlON) Gate Dielectric on Structural Transformation and Electrical Properties through High-Temperature Annealing," Japanese Journal of Applied Physics Part 1, vol. 43, No. 4B, pp. 1788-1794 (2004).

Pant, G., et al., "Comparison of Electrical and Chemical Characteristics of Ultrathin HfON Versus HfSiON Dielectrics," Applied Physics Letter,s vol. 89, No. 3, p. 032904 (2006).

Yu, X., et al., "The Role of Nitrogen on Charge-Trapping-Induced $V_{th}$ Instability in HfFAlON High-κ Gate Dielectric With Metal and Poly-Si Gate Electrodes," IEEE Transactions on Electron Devices, vol. 54, No. 8, pp. 1972-1977 (2007).

Migita, S. et al., "Design and Demonstration of Very High-k (k-50) $HfO_2$ for Ultra-Sealed CMOS," Symposium on VLSI Technology Digest of Technical Papers, pp. 152-153 (2008).

* cited by examiner (M: MONOCLINIC-SPECIFIC PEAK)

METHOD OF MANUFACTURING DIELECTRIC FILM THAT HAS HAFNIUM-CONTAINING AND ALUMINUM-CONTAINING OXYNITRIDE

CROSS-REFERENCES TO RELATED APPLICATIONS

This application is a continuation application of International Application No. PCT/JP2009/065306, filed on Sep. 2, 2009, the entire contents of which are incorporated by reference herein.

This application also claims the benefit of priority from Japanese Patent Application No. 2008-282163 filed Oct. 31, 2008, the entire contents of which are incorporated herein by reference.

TECHNICAL FIELD

The present invention relates to a method of manufacturing a dielectric film and a semiconductor device using a dielectric film.

BACKGROUND ART

Developments in semiconductor devices are accompanied by increasingly higher degrees of element integration, resulting in increased miniaturization of each element and a reduction in operating voltage. For example, in the field of MONOS (metal oxide nitride oxide semiconductor)-type non-volatile semiconductor devices which include a blocking film that separates a charge retaining layer and a gate electrode with the miniaturization of elements, the miniaturization of elements has led to demands for higher permittivity in blocking films. Similarly, in the field of FG (floating gate)-type non-volatile semiconductor devices, the miniaturization of elements has led to demands for higher permittivity in insulating films between a floating electrode and a gate electrode. Furthermore, in the field of advanced CMOS device development, techniques for reducing gate leakage current by increasing the physical thickness of a gate insulating film using high permittivity material are being considered. Moreover, it is required that high dielectric films are heat-resistant with respect to a 1000° C.-annealing treatment performed during the manufacturing process of the semiconductor devices described above. Furthermore, it is required that the surfaces of high dielectric films have superior flatness for the purpose of suppressing variations in the operating voltages of the semiconductor devices.

As means for increasing the relative permittivity of a dielectric film, the use of $HfO_2$, $ZrO_2$, and $Al_2O_3$ as dielectric films having a higher relative permittivity than conventional $SiO_2$ film, SiN film, or SiON film combining the two, is being considered. In addition, more recently, research is being performed on dielectric films in which a metallic element is doped on a laminated(stacked) structure made of $HfO_2$, $ZrO_2$, or $Al_2O_3$ or on $HfO_2$ or $ZrO_2$ for the purpose of suppressing leakage current associated with thinner dielectric films.

Methods of forming a high dielectric film include a CVD (chemical vapor deposition) method, an atomic layer adsorption/deposition method, and a sputtering method. A CVD method involves an incubation time during the formation process and is therefore problematic with respect to film thickness controllability, in-plane uniformity, and reproducibility. On the other hand, with a sputtering method, an interfacial layer is problematically formed due to plasma damage or oxidation of a processed substrate.

As a technique of forming a high-permittivity dielectric film by an ALD method or a CVD method, Patent Document 1 discloses a noncrystalline film made of $Al_xM_{(1-x)}O_y$ (where M is a metal such as Hf and Zr capable of forming a crystalline dielectric) having a composition expressed as 0.05<x<0.3 in which noncrystalline aluminum oxide is contained in a crystalline dielectric. A feature of the technique is that a high relative permittivity ranging from 25 to 28 can be obtained with noncrystalline zircon aluminate. In addition, a relative permittivity of $ZrO_2$ of 30 is described in Patent Document 1.

In addition, as a method of forming a high-permittivity dielectric film by sputtering, Patent Document 2 discloses a technique of forming $ZrO_2$ by a sputtering method utilizing electron cyclotron resonance in a range where a stoichiometric composition is attained and in an oxygen supply range where the rate of decrease in sputtering rate arising from target surface oxidation reaches maximum.

Furthermore, Patent Document 3 describes a dielectric film in which ceramic targets of $HfO_2$ and $Y_2O_3$ are used as sputtering targets and $HfO_2$ is doped with yttrium (Y) as a metallic element and with nitrogen. According to Patent Document 3, it is described that by adding an element with a large atomic radius such as Y described above to monoclinic $HfO_2$, aggregated energy of the cubical crystals decreases and stabilizes, and consequently, the crystalline system of $HfO_2$ changes from monoclinic to tetragonal and then to cubical. As a result, it is described that a high dielectric film made of HfYO with a relative permittivity of 70 can be obtained. In addition, as oxygen in the monoclinic $HfO_2$ is progressively replaced with nitrogen, the crystalline system changes from monoclinic to tetragonal, to rhombohedral, and then to cubical as the amount of nitrogen increases.

Patent Document 4 describes that with respect to a dielectric film made of $Zr_xSi_{(1-x)}O_{(2-y)}$ ($0.81 \leq x \leq 0.99$, $0.04 \leq y \leq 0.25$), a dielectric film having tetragonal crystals is formed using Zr and Si targets by forming an amorphous film using a sputtering method in a mixed atmosphere of argon and oxygen and subsequently performing an annealing treatment at 750° C. or higher on the amorphous film in an atmosphere containing oxygen.

Non-Patent Document 1 describes a dielectric film in which TiN is laminated(stacked) on the surface of $HfO_2$ formed by an RF sputtering method. According to Non-Patent Document 1, it is described that when crystallization is performed in a state where TiN is laminated on $HfO_2$, $HfO_2$ having a cubic crystalline phase is formed and a dielectric film having a relative permittivity value of 50 is obtained.

Patent Documents

Patent Document 1: Japanese Patent Application Laid-Open No. 2004-214304
Patent Document 2: Japanese Patent No. 3748218
Patent Document 3: Japanese Patent No. 3981094
Patent Document 4: Japanese Patent Application Laid-Open No. 2007-299878

Non-Patent Documents

Non-Patent Document 1: Symposium on VLSI Technology Digest of Technical Papers, 2008, p. 152

DISCLOSURE OF THE INVENTION

However, the techniques described above respectively have the following problems.

With the technique described in Patent Document 1 in which Al is included within a range of 5 to 30% in $ZrO_2$, a problem arises in that while a high relative permittivity value of 25 to 28 is obtained with a noncrystalline structure, the value is nevertheless lower than the relative permittivity value of 30 of $ZrO_2$ having a crystalline structure.

The technique described in Patent Document 2 of forming $ZrO_2$ utilizing electron cyclotron resonance is problematic in that the relative permittivity value of $ZrO_2$ obtained by an annealing treatment at 660° C. to 880° C. is 12, which is significantly lower in comparison with the dielectric film described in Patent Document 1. Patent Document 2 is also problematic in that no mention is made on the crystalline structure of $ZrO_2$.

The technique described in Patent Document 3 of forming a HfYO film is advantageous in that a high permittivity film with a relative permittivity value of 70 can be obtained. However, there is a problem in that the decrease in sputtering rate with a sputtering method using ceramic targets made of $HfO_2$ and $Y_2O_3$ as sputtering targets significantly slows down the deposition rate of a dielectric film.

The technique described in Patent Document 4 of forming a dielectric film made of $Zr_xSi_{(1-x)}O_{(2-y)}$ ($0.81 \leq x \leq 0.99$, $0.04 \leq y \leq 0.25$) and having a tetragonal crystalline structure is problematic in that the relative permittivity value of the obtained dielectric film of 20 to 26 is low in comparison with $ZrO_2$ described in Patent Document 1.

The technique described in Non-Patent Document 1 of forming $HfO_2$ having cubical crystals by performing crystallization in a state where TiN is laminated on the surface of $HfO_2$ formed by an RF sputtering method is advantageous in that a high permittivity film with a relative permittivity value of 50 can be obtained. However, there is a problem in that the decrease in sputtering rate with a sputtering method using a ceramic target made of a $HfO_2$ metal oxide as a sputtering target significantly slows down the deposition rate of a dielectric film. In addition, since obtaining high permittivity requires that TiN be laminated on a $HfO_2$ film and subjected to an annealing treatment, there is a concern that a decrease in film quality may occur due to oxidation caused by interfacial reaction between $HfO_2$ and TiN during the annealing process. Furthermore, it is shown that while a relative permittivity value of 50 is obtained by an annealing treatment at 700° C. to 800° C., relative permittivity drops to 30 or lower after an annealing treatment at 800° C. or higher. Therefore, cubic $HfO_2$ formed of a laminated film of TiN and $HfO_2$ also problematically lacks heat resistance with respect to annealing treatment at 1000° C.

The present invention has been made in consideration of the conventional problems described above, and an object thereof is to provide a method of manufacturing of forming a dielectric film capable of solving the problems described above and reducing declines in deposition rate due to a reduction in sputtering rate, and having a high relative permittivity, heat resistance with respect to 1000° C.-annealing treatment, and superior film surface flatness.

An intense deliberation by the present inventors to resolve the problems described above has led to a discovery in which by forming a metallic oxynitride having a specific composition and a noncrystalline structure and further performing an annealing treatment, a dielectric film with a high relative permittivity, a high-temperature heat resistance with respect to 1000° C., and superior flatness can be obtained, which resulted in the present invention.

A first aspect of the present invention is a method of manufacturing a dielectric film including a metallic oxynitride containing an element A being Hf or a mixture of Hf and Zr, an element B being Al, and N and O, the manufacturing method comprising: a step of forming a metallic oxynitride whose mole fraction of the element A, the element B, and N expressed as B/(A+B+N) has a range of $0.015 \leq (B/(A+B+N)) \leq 0.095$ and mole fraction of the element A, element B, and N expressed as N/(A+B+N) has a range of $0.045 \leq (N/(A+B+N))$ and whose mole fraction of the element A and O expressed as O/A has a range of $1.0<(O/A)<2.0$, and having a noncrystalline structure; and a step of performing an annealing treatment at 700° C. or higher on the metallic oxynitride having a noncrystalline structure to form a metallic oxynitride including a crystalline phase with a cubical crystal incorporation percentage of 80% or higher.

A second aspect of the present invention is a method of manufacturing a non-volatile semiconductor device including: a substrate with at least a surface including a semiconductor layer; a gate electrode formed on the substrate; and a laminated gate insulating film sequentially laminated between the substrate and the gate electrode, wherein at least one layer among the insulating films that make up the laminated gate insulating film is formed by the method according to the first aspect of the present invention.

A third aspect of the present invention is a method of manufacturing a non-volatile semiconductor device having: a substrate with at least a surface including a semiconductor layer; a gate electrode formed on the substrate; and an insulating film, a floating electrode, and a structure in which insulating films are laminated in sequence between the substrate and the gate electrode, wherein at least a portion of the insulating films formed between the gate electrode and the floating electrode is formed by the method according to the first aspect of the present invention.

A fourth aspect of the present invention is a method of manufacturing a semiconductor device having, on a substrate with at least a surface including a semiconductor layer, a source region, a drain region, and a gate electrode formed via an insulating film, wherein the insulating film is formed by the method according to the first aspect of the present invention.

A fifth aspect of the present invention is a dielectric film including a metallic oxynitride containing an element A being Hf or a mixture of Hf and Zr, an element B being Al, and N and O, wherein mole fraction of the element A, the element B, and N expressed as B/(A+B+N) has a range of $0.015 \leq (B/(A+B+N)) \leq 0.095$ and mole fraction of the element A, the element B, and N expressed as N/(A+B+N) has a range of $0.045 \leq (N/(A+B+N))$, and mole fraction of the element A and O expressed as O/A has a range of $1.0<(O/A)<2.0$.

A sixth aspect of the present invention is a computer-readable storage medium storing a program for causing a computer to execute a method of forming a high dielectric film included in an MIS capacitor, wherein the method of forming includes: a first step of depositing on a silicon substrate having a silicon dioxide film, by physical vapor deposition using a metallic target containing Hf or a mixture of Hf and Zr and a metallic target of Al, a dielectric film including a metallic oxynitride containing an element A being Hf or a mixture of Hf and Zr, an element B being Al, and N and O, wherein the dielectric film is deposited by setting oxygen supply such that mole fraction O/A of the element A and O falls within a range of $1.0<(O/A)<2.0$; a second step of depositing a film selected from among a TiN film, Ti, TaN, W, Pt, Ru, Al, and Si on the dielectric film by physical vapor deposition using a metallic target; and a third step, after the first step or the second step, of performing an annealing treatment and crystallizing the dielectric film.

A seventh aspect of the present invention is a computer-readable storage medium storing a program for causing a computer to execute a method of forming a MOSFET including a high dielectric film, wherein the method of forming includes: a first step of forming an element isolation region on a silicon substrate by STI; a second step of forming a silicon dioxide film on the element-isolated silicon substrate by a thermal oxidation method; a third step of depositing on the silicon dioxide film, by physical vapor deposition using metallic targets of Hf and Al, a dielectric film including a metallic oxynitride containing an element A being Hf or a mixture of Hf and Zr, an element B being Al, and N and O, wherein the dielectric film is deposited by setting oxygen supply such that mole fraction O/A of the element A and O falls within a range of $1.0<(O/A)<2.0$; a fourth step of forming a gate electrode film on the dielectric film; a fifth step of processing the gate electrode film using lithography and RIE; a sixth step of performing ion implantation and forming an extension region using the processed gate electrode film as a mask; a seventh step of depositing a silicon nitride film and a silicon dioxide film on the silicon substrate on which the extension region has been formed; an eighth step of forming a gate sidewall by etching back the deposited silicon nitride film and silicon dioxide film; and a ninth step of performing ion implantation and forming a source-drain region under the extension region.

An eighth aspect of the present invention is a computer-readable storage medium storing a program for causing a computer to execute a method of forming a non-volatile memory element or a FG non-volatile semiconductor element including a high dielectric film, wherein the method of forming includes: a first step of forming an element isolation region on a silicon substrate by STI; a second step of forming a first insulating film on the element-isolated silicon substrate by a thermal oxidation method; a third step of forming a second insulating film on the first insulating film by LPCVD; a fourth step of forming a third insulating film on the second insulating film using any of MOCVD, ALD, and PVD; a fifth step of forming, on the third insulating film, by physical vapor deposition using metallic targets of Hf and Al, a high dielectric film, which is a fourth insulating film, including a metallic oxynitride containing an element A being Hf or a mixture of Hf and Zr, an element B being Al, and N and O, the high dielectric film, wherein the high dielectric film which is the fourth insulating film is deposited by setting oxygen supply such that mole fraction O/A of the element A and O falls within a range of $1.0<(O/A)<2.0$; a sixth step of forming a fifth insulating film on the fourth insulating film using any of MOCVD, ALD, and PVD; a seventh step of forming a gate electrode film on the fifth insulating film; an eighth step of processing the gate electrode film using a lithographic technique and an RIE technique; a ninth step of performing ion implantation and forming an extension region using the processed gate electrode film as a mask; a tenth step of depositing a silicon nitride film and a silicon dioxide film on the silicon substrate on which the extension region has been formed; an eleventh step of forming a gate sidewall by etching back the deposited silicon nitride film and silicon dioxide film; and a twelfth step of performing ion implantation and forming a source-drain region under the extension region.

According to the present invention, a dielectric film having (1) a relative permittivity value of 40 or higher, (2) heat resistance with respect to high-temperature annealing at 1000° C., and (3) superior flatness can be obtained. Consequently, even when the method of manufacturing a dielectric film according to the present invention is applied to method of manufacturing a gate insulating film of a CMOS transistor element, a method of manufacturing a blocking insulating film of a MONOS non-volatile semiconductor element; or a method of manufacturing an insulating film between a floating electrode and a gate electrode of an FG non-volatile semiconductor element, these methods including a high-temperature annealing treatment process, thinning of an equivalent oxide thickness (EOT) due to higher permittivity can be achieved.

DESCRIPTION OF THE PREFERRED EMBODIMENTS

Hereinafter, embodiments of the present invention will be described in detail with reference to the drawings.

A dielectric film formed according to the present invention will now be described using an example of an MIS (metal insulator semiconductor) capacitor in which a HfAlON film using Hf as an element A, and Al as an element B is formed as a dielectric film on a silicon substrate having a silicon dioxide film on a surface thereof.

Figure 1:
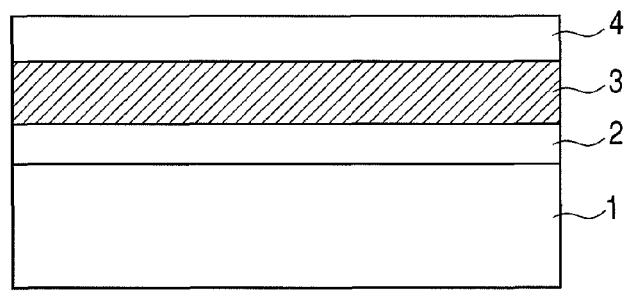
FIG. 1 is a cross-sectional diagram of an MIS capacitor on which a dielectric film is formed according to the present invention.

As illustrated in FIG. 1, a HfAlON film 3 having a non-crystalline structure was deposited on a silicon substrate 1 having, on a surface thereof, a silicon dioxide film 2 with a film thickness ranging from 3 nm to 5 nm.

Figure 2:
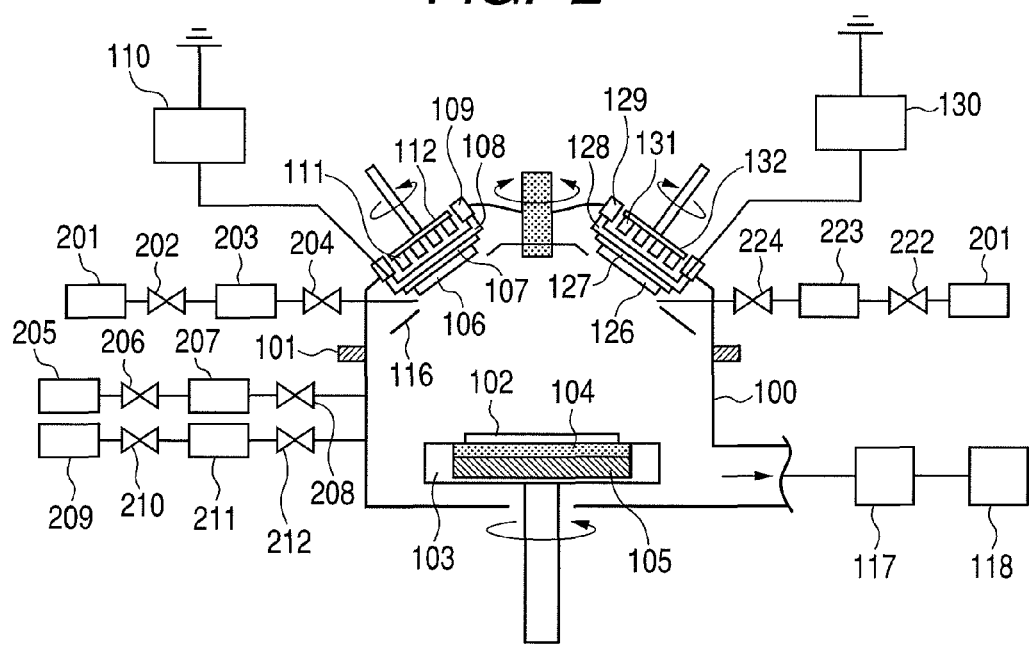
FIG. 2 is a diagram illustrating an outline of an example of a processing apparatus used in a process of forming a metallic oxynitride film having a noncrystalline structure.

FIG. 2 illustrates an outline of an example of a processing apparatus used in a process of forming a HfAlON film having a noncrystalline structure.

A film formation processing chamber 100 is arranged so as to be heatable to a predetermined temperature by a heater 101. A processed substrate 102 is arranged so as to be heatable to a predetermined temperature by a heater 105 via a susceptor 104 built into a substrate support table 103. From the perspective of film thickness uniformity, the substrate support table 103 is preferably capable of rotating at a predetermined rotational speed. Targets 106 and 126 are set in the film formation processing chamber 100 at positions overlooking the processed substrate 102.

The targets 106 and 126 are set on target holders 108 and 128 via back plates 107 and 127 made from metal such as Cu. Alternatively, an outer form of a target assembly combining the targets 106 and 126 with the back plates 107 and 127 may be created as a single part from the target material and mounted as a target. In other words, a configuration in which a target is installed on a target holder can also be adopted.

Direct current power supplies 110 and 130 that apply power for sputtering discharge are connected to the target holders 108 and 128 made from metal such as Cu, and are insulated from the walls of the film formation processing chamber 100 at ground potential by insulators 109 and 129.

Magnets 111 and 131 for realizing magnetron sputtering are positioned behind the targets 106 and 126 as seen from sputtering planes. The magnets 111 and 131 are held by magnet holders 112 and 132 and are arranged so as to be rotatable by magnet holder rotating mechanisms, not illustrated. To ensure uniform erosion of the targets, the magnets 111 and 131 are rotated during discharge.

The targets 106 and 126 are set at positions offset diagonally upwards with respect to the substrate 102. In other words, central points of the sputtering planes of the targets 106 and 126 are positioned so as to be displaced by predetermined distances from a normal of a central point of the substrate 102.

Shields 116 are set between the targets 106 and 126 and the processed substrate 102, and control film formation on the processed substrate 102 due to sputtered particles emitted from power-supplied targets 106 and 126.

In the present embodiment, a metallic target 106 made of Hf and a metallic target 126 made of Al are used. Deposition of the dielectric film 3 is performed by supplying power to the metallic targets 106 and 126 from the direct current power supplies 110 and 130, respectively, via the target holders 108 and 128 and the back plates 107 and 127. In doing so, an inert gas is introduced from an inert gas source 201 near the targets to the processing chamber 100 via valves 202 and 222, mass flow controllers 203 and 223, and valves 204 and 224. In addition, a reactive gas including oxygen is introduced from an oxygen gas source 205 to the vicinity of the substrate in the processing chamber 100 via a valve 206, a mass flow controller 207, and a valve 208. Furthermore, a reactive gas including nitrogen is introduced from a nitrogen gas source 209 to the vicinity of the substrate in the processing chamber 100 via a valve 210, a mass flow controller 211, and a valve 212. The introduced inert gas and reactive gases are exhausted by an exhaust pump 118 via a conductance valve 117.

Film formation was performed by setting substrate temperature to 30° C., Hf target power to 600 W, and Al target power to within a range of 0 W to 300 W, using Ar as an inert gas, setting Ar supply to 60 sccm, setting the supply of nitrogen that is a reactive gas to within a range of 1.5 sccm to 5 sccm, and setting the supply of oxygen that is a reactive gas to within a range of 0 sccm to 40 sccm.

Figure 3:
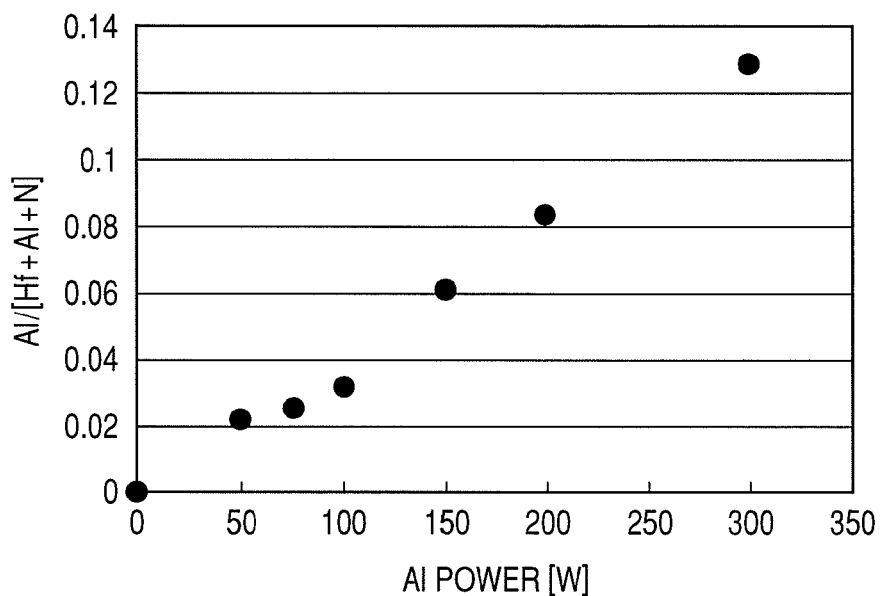
FIG. 3 is a diagram illustrating an Al target power dependence of a composition X of a HfAlON film.

At this point, a mole fraction Al/(Hf+Al+N) of the HfAlON film was adjusted by the power applied to the Al target. FIG. 3 illustrates an Al target power dependence of the mole fraction Al/(Hf+Al+N) of the HfAlON film. Composition was evaluated by an analysis using XPS (X-ray photoelectron spectroscopy). It was confirmed that by adjusting the Al target power in this manner, the mole fraction Al/(Hf+Al+N) can be controlled so as to fall within a range of 0 to 0.20. In addition, a mole fraction O/A was adjusted by oxygen supply. Furthermore, a mole fraction N/(Hf+Al+N) was adjusted by nitrogen supply.

Using the formation process described above, a HfAlON film, a HfON film not including Al, a HfAlO film not including N, and a $HfO_2$ film not including N and Al were formed at a film thickness of 5 nm to 25 nm.

Next, the formed HfAlON film, HfON film, HfAlO film, and $HfO_2$ film were crystallized by performing annealing treatments in a nitrogen atmosphere at 600° C. to 1000° C. to create the dielectric film 3.

A TiN film 4 with a film thickness of 10 nm was then deposited by a sputtering method on the dielectric film 3. Alternatively, crystallization may be achieved by performing an annealing treatment after depositing the TiN film 4 on the dielectric film 3.

Next, the TiN film 4 was processed to a desired size using a lithographic technique and an RIE (reactive ion etching) technique to form an MIS capacitor structure. In this case, the electrical characteristics was evaluated assuming that the silicon substrate 1 was the lower electrode and the TiN film 4 the upper electrode.

Figure 4:
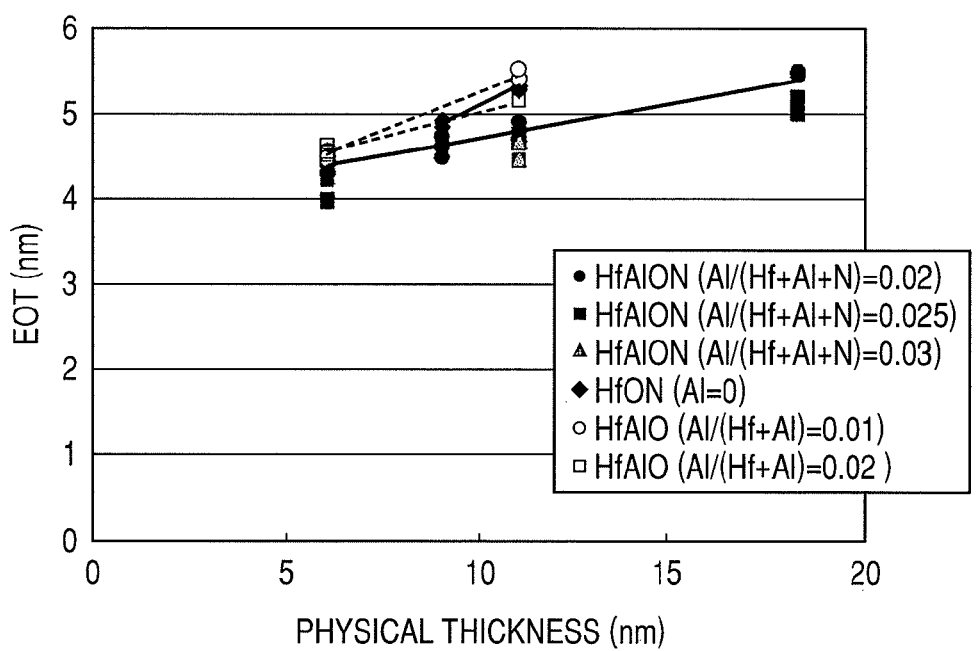
FIG. 4 is a diagram illustrating a relationship between EOT and physical film thickness of the MIS capacitor illustrated in FIG. 1.

FIG. 4 illustrates relationships between an equivalent oxide thickness (EOT) and a physical thickness of a sample in which a mole fraction Al/(Hf+Al+N) of a HfAlON film was altered, a sample in which a mole fraction Al/(Hf+Al) of a HfAlO film was altered, and a sample in which a HFON film was formed. In this case, film formation is performed so that O/Hf of the HfAlON film takes a value of 1.9 and N/(Hf+Al+N) takes a value of 0.08. All samples have been crystallized by a 1000° C.-annealing treatment.

Equivalent oxide thickness (EOT) will now be described. Regardless of the insulating film type, assuming that the insulating film material is a silicon dioxide film, an electrical film thickness of an insulating film obtained by a back calculation from capacity is referred to as an equivalent oxide thickness. That is, if $\in_h$ denotes a relative permittivity of an insulating film, $\in_o$ denotes a relative permittivity of a silicon dioxide film, and $d_h$ denotes a thickness of the insulating film, then an equivalent oxide thickness $d_e$ may be expressed by the following equation (1).

$$d_e = d_h \times (\in_o / \in_h) \quad (1)$$

The above equation (1) indicates that when a material having a permittivity $\in_h$ greater than the relative permittivity $\in_0$ of a silicon dioxide film is used in an insulating film, equivalent oxide thickness $d_e$ becomes equivalent to that of a silicon dioxide film thinner than the film thickness $d_h$ of the insulating film. The relative permittivity $\in_0$ of a silicon dioxide film is around 3.9. Therefore, for example, with a film made of a high permittivity material of $\in_h$=39, even if the physical thickness thereof $d_h$ is set to 15 nm, the equivalent oxide thickness (electrical thickness) $d_e$ takes a value of 1.5 nm. As such, leakage current can be significantly reduced while maintaining the capacitance of the insulating film at a level similar to a silicon dioxide film with a film thickness of 1.5 nm.

From FIG. 4, it is confirmed that the EOT of the HfAlON film with a physical thickness of 11 nm is 4.6 nm, and that thinning of EOT is achieved in comparison to the HfAlO film (EOT=5.5 nm) and the HfON film (EOT=5.3 nm) with the same physical thicknesses.

Figure 5:
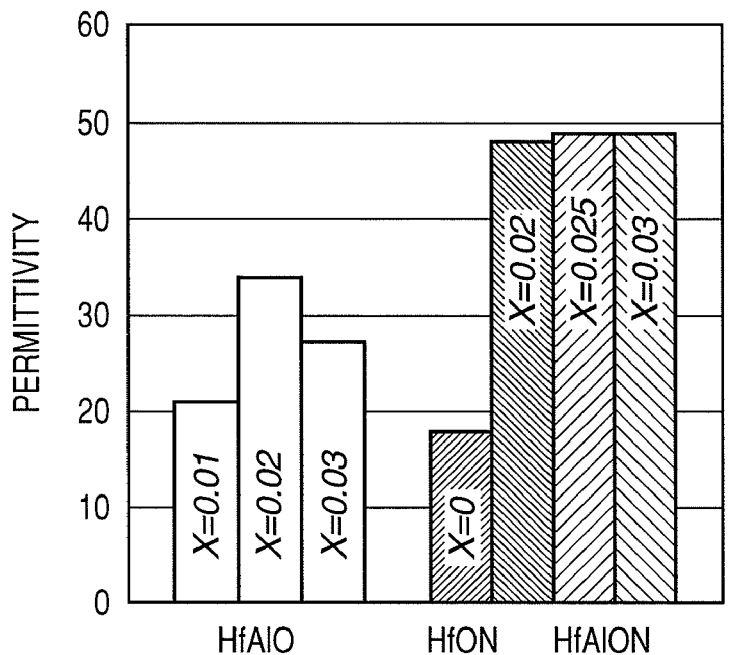
FIG. 5 is a diagram illustrating a relationship between relative permittivity and dielectric film composition of the MIS capacitor illustrated in FIG. 1.

FIG. 5 illustrates values of relative permittivity derived from the EOT and physical thickness obtained in FIG. 4. Reference character X in the figure denotes a mole fraction Al/(Hf+Al+N) and a mole fraction Al/(Hf+Al). From FIG. 5, it is revealed that the HfAlON film has a relative permittivity of 48 which is significantly greater than the relative permittivity values of the HfAlO film and the HfON film which range from 15 to 35.

Figure 6:
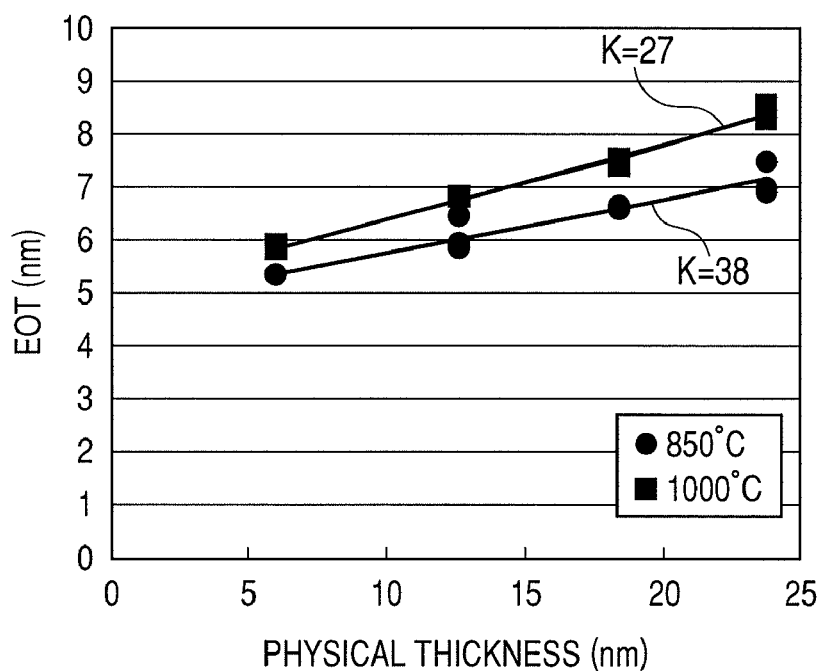
FIG. 6 is a diagram illustrating annealing temperature dependence of EOT and physical film thickness of the MIS capacitor illustrated in FIG. 1.

Next, FIG. 6 illustrates annealing temperature dependences of EOT and physical thickness of a HfAlO film having a mole fraction Al(Hf+Al) of 0.03. From FIG. 6, it is confirmed that a HfAlO film subjected to a 1000° C.-annealing treatment manifests an increase in EOT due to a decrease in relative permittivity value in comparison to a HfAlO film subjected to an 850° C. annealing treatment. This result indicates that a HfAlO film not including N is not heat resistant with respect to a 1000° C.-annealing treatment, thereby revealing that the inclusion of N provides heat resistance with respect to high-temperature annealing at 1000° C.

Figure 7:
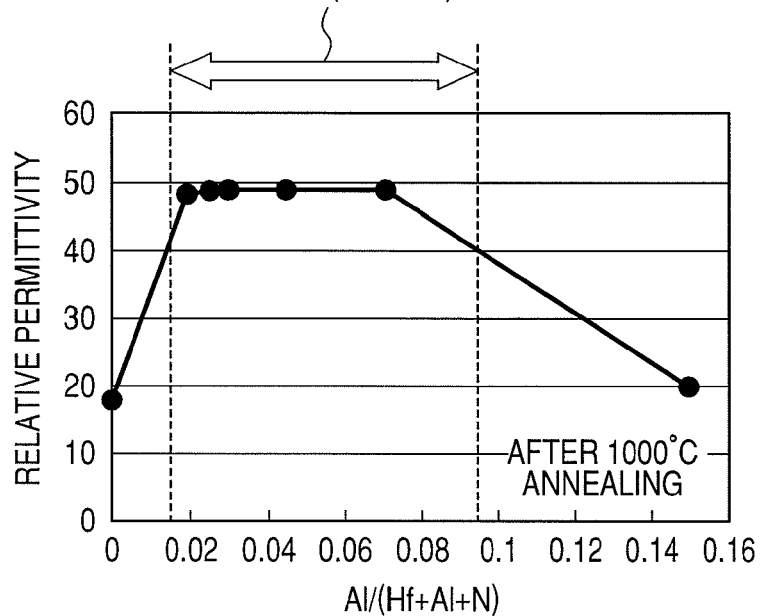
FIG. 7 is a diagram illustrating a relationship between relative permittivity and dielectric film composition of the MIS capacitor illustrated in FIG. 1.

FIG. 7 illustrates a relationship between relative permittivity and a mole fraction Al/(Hf+Al+N) of a HfAlON film crystallized by a 1000° C.-annealing treatment. From FIG. 7, it is confirmed that a relative permittivity value of 40 or higher is obtained when the mole fraction Al/(Hf+Al+N) ranges from 0.015 to 0.095. Therefore, it is necessary that the mole fraction Al/(Hf+Al+N) of the HfAlON film ranges from 0.015 to 0.095 and preferably from 0.02 to 0.07 where a significant EOT thinning effect can be obtained.

Figure 8:
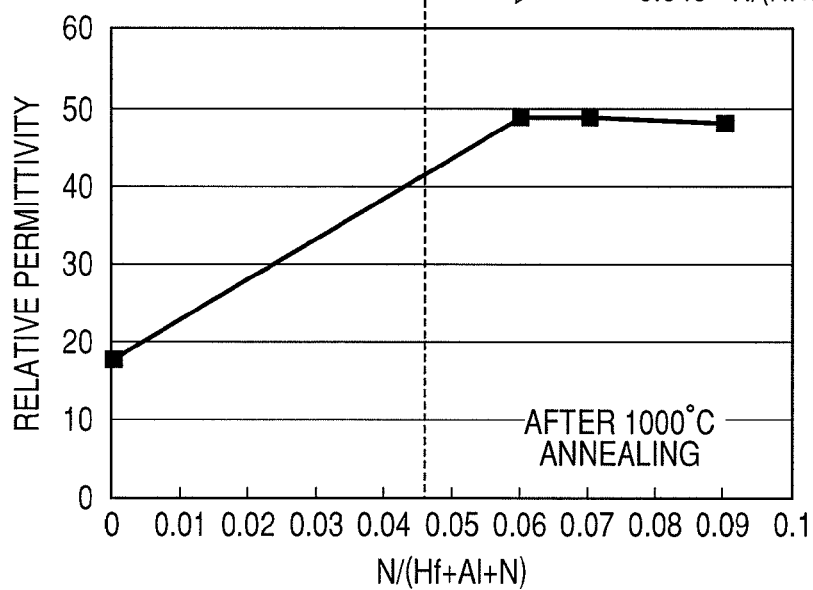
FIG. 8 is a diagram illustrating a relationship between relative permittivity and dielectric film composition of the MIS capacitor illustrated in FIG. 1.

FIG. 8 illustrates a relationship between relative permittivity and a mole fraction N/(Hf+Al+N) of a HfAlON film (Al/(Hf+Al+N)=0.02) crystallized by a 1000° C.-annealing treatment. From FIG. 8, it is confirmed that a relative permittivity value of 40 or higher is obtained when the mole fraction N/(Hf+Al+N) falls within a range that equals or exceeds 0.045. A mole fraction N/(Hf+Al+N) of less than 0.045 results in lower heat resistance, and relative permittivity is reduced due to a 1000° C.-annealing treatment.

Figure 9:
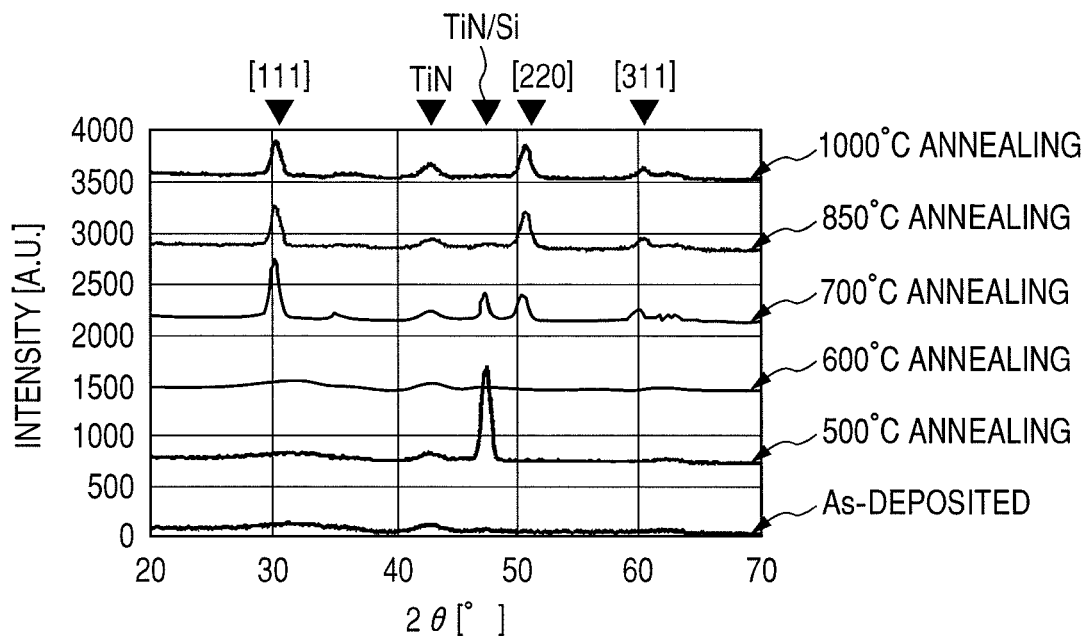
FIG. 9 is a diagram illustrating relationships between XRD spectrums and annealing temperatures of dielectric films.

Next, FIG. 9 illustrates an annealing temperature dependence of X-ray diffraction spectrums of a HfAlON film having a mole fraction Al/(Hf+Al+N) of 0.03 and a mole fraction N/(Hf+Al+N) of 0.08. From FIG. 9, it is confirmed that a HfAlO film has a noncrystalline structure in a range from an as-deposited state to an annealing temperature of 600° C. and is crystallized at an annealing temperature of 700° C. or higher. In addition, peaks of [111], [220], and [311] representing crystal orientations of cubical crystals and tetragonal crystals can be observed near 2θ=30°, 50°, and 60° of the spectrums. An evaluation of incorporation percentages of cubical crystals and tetragonal crystals in the XRD spectrums revealed that the incorporation percentage of cubical crystals is 80% or higher. Therefore, a dielectric film according to the present invention has a crystalline phase mainly consisting of cubical crystals, and the effects of the dielectric film can be sufficiently exerted if the dielectric film contains 80% or more cubical crystals.

Figure 10:
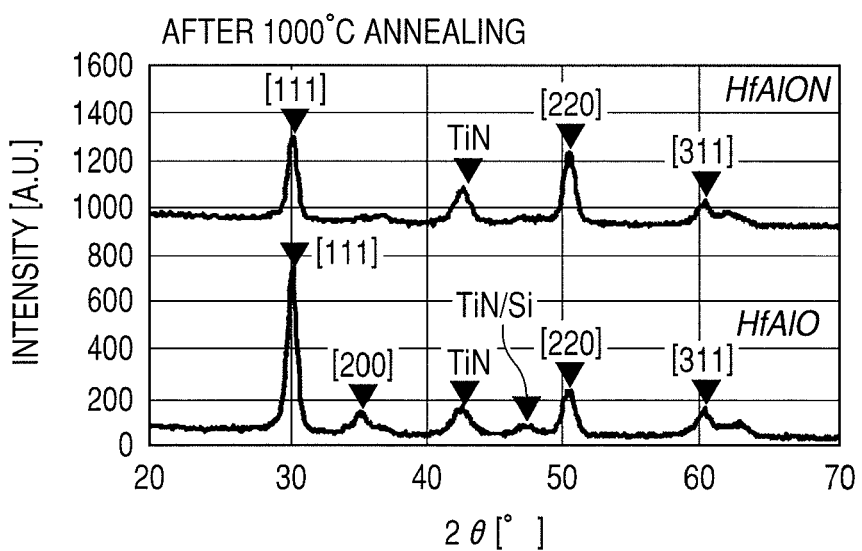
FIG. 10 is a diagram illustrating XRD spectrums of dielectric films.
Figure 11:
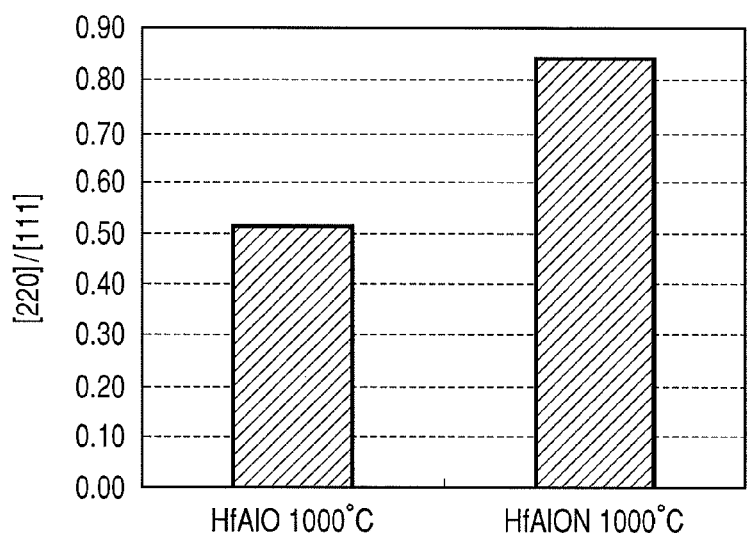
FIG. 11 is a diagram illustrating relationships of peak intensity ratios [220]/[111] in XRD spectrums of dielectric films.

Next, crystalline structures of a HfAlON film (mole fraction Al/(Hf+Al+N)=0.03, mole fraction N/(Hf+Al+N)=0.08) and a HfAlO film (mole fraction Al/(Hf+Al)=0.03) were evaluated by an X-ray diffraction method. The respective X-ray diffraction spectrums are illustrated in FIG. 10. From FIG. 10, it is apparent that both the HfAlON film and the HfAlO film have crystalline structures mainly consisting of cubical crystals. From the above, it is shown that the higher permittivity and improved heat resistance in a HfAlON film containing Al and N are not attributable to a change in crystalline systems as described in the literature listed above. FIG. 11 illustrates the result of a comparison between [220] peak intensity and [111] peak intensity in the X-ray diffraction spectrums of the HfAlON film and the HfAlO film illustrated in FIG. 10. From FIG. 11, it is apparent that a [220]/[111] peak intensity ratio of the HfAlON film is higher than the peak intensity ratio of the HfAlO film. Therefore, it is conceivable that higher permittivity and improved heat resistance in a HfAlON film containing Al and N are related to orientations in crystalline phases.

Figure 12:
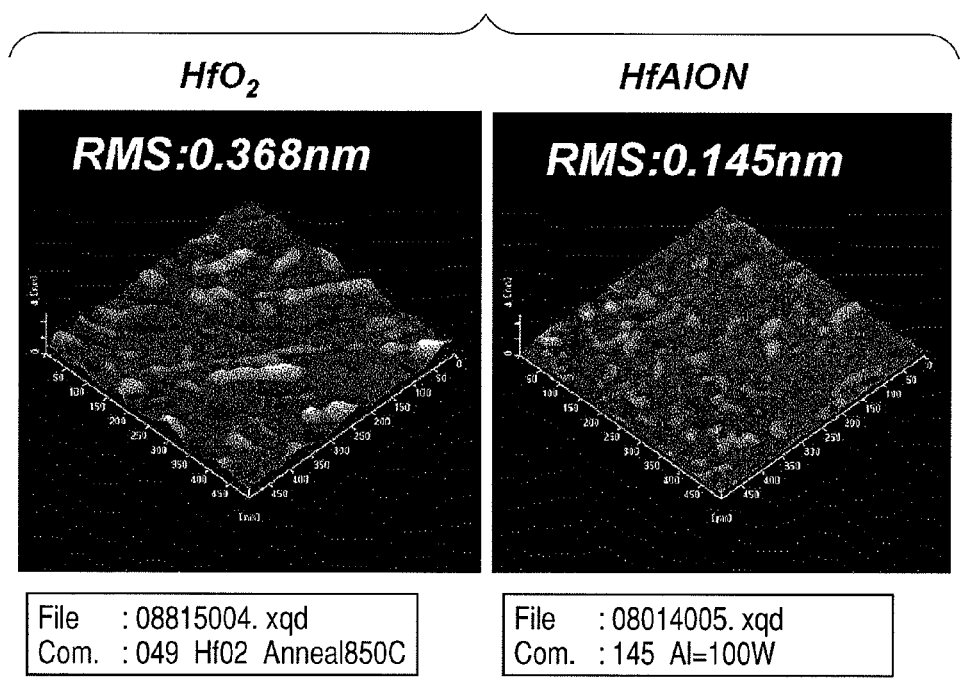
FIG. 12 is a diagram illustrating AFM images of dielectric films.

Next, FIG. 12 illustrates results of an AFM evaluation of surface flatnesses of a $HfO_2$ film and a HfAlON film (mole fraction Al/(Hf+Al+N)=0.025, mole fraction N/(Hf+Al+N)=0.08) crystallized by an annealing treatment. RMS (root-mean-square) in the diagram denotes a root-mean-square roughness of a dielectric film surface. From FIG. 12, it is confirmed that the HfAlON film has a smaller RMS value compared to the $HfO_2$ film and therefore has superior flatness.

Figure 13:
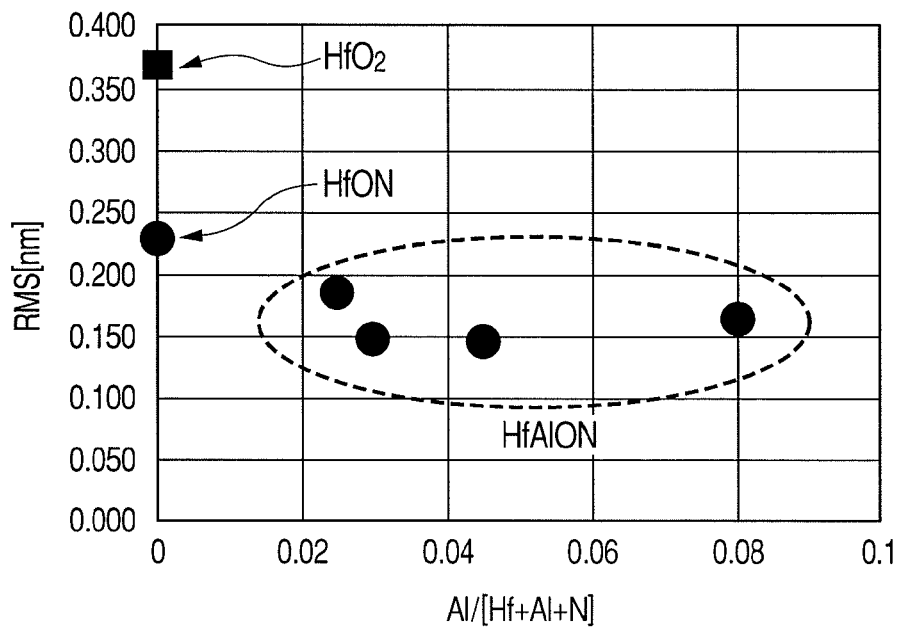
FIG. 13 is a diagram illustrating relationships between surface flatness and dielectric film composition of dielectric films.

FIG. 13 illustrates relationships between RMS measured by AFM and mole fractions Al/(Hf+Al+N) of a $HfO_2$ film, a HfON film, and a HfAlON film (mole fraction N/(Hf+Al+N)=0.08) whose mole fraction Al/(Hf+Al+N) has been altered. From FIG. 13, it is apparent that an RMS value drops by including N in a $HfO_2$ film, and a further decrease in the RMS value occurs by including both N and Al. In particular, it is confirmed that a dielectric film with a small RMS value and superior flatness is formed when the mole fraction Al/(Hf+Al+N) ranges from 0.025 to 0.08.

Figure 14:
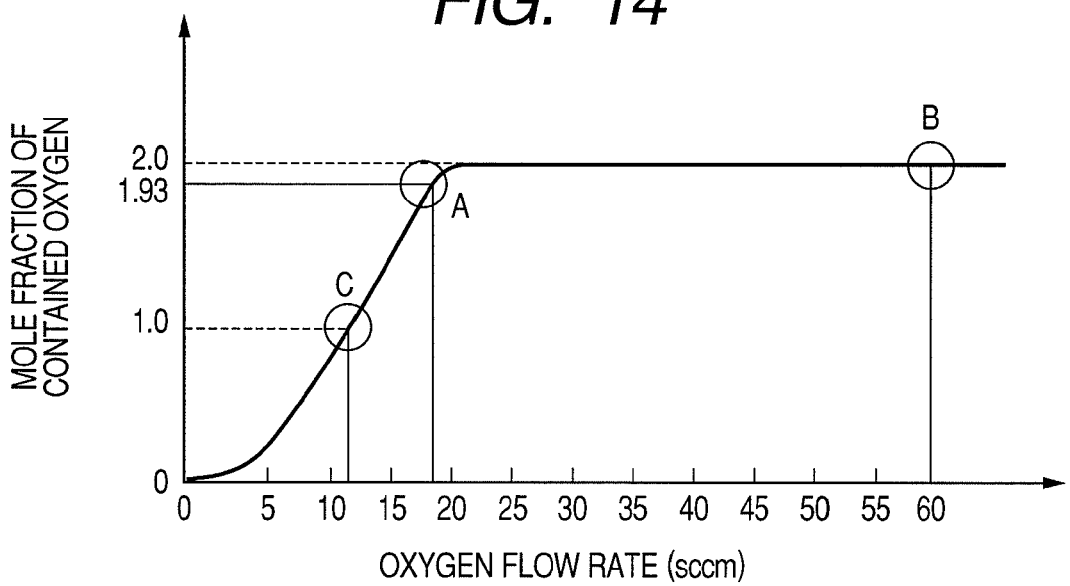
FIG. 14 is a diagram illustrating a relationship between mole fractions of oxygen contained in dielectric films and oxygen supply during a deposition process of a dielectric film.

Next, a relationship between a mole fraction O/Hf of a deposited $HfO_2$ film and oxygen flow rate during deposition is illustrated in FIG. 14. The mole fraction of oxygen was measured by XPS. From FIG. 14, it is confirmed that oxygen has a mole fraction of 2.0 which constitutes a stoichiometric ratio in a region where the oxygen flow rate equals or exceeds 20 sccm.

Figure 15:
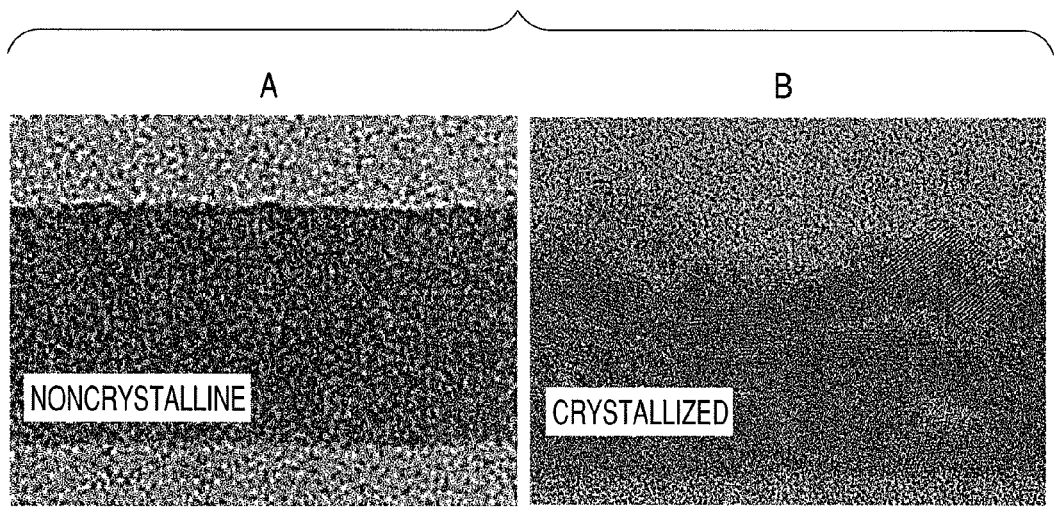
FIG. 15 is a diagram illustrating cross-sectional TEM images of dielectric films.

Next, FIG. 15 illustrates cross-sectional TEM images of a metal-oxide film made of $HfO_2$ and formed under an oxygen supply of 18 sccm (point A) and an oxygen flow rate of 60 sccm (point B) as indicated in FIG. 14. From FIG. 15, it is apparent that the $HfO_2$ obtained under condition A is non-crystalline and has superior surface flatness. On the other hand, it is confirmed that the $HfO_2$ obtained under condition B has been crystallized and has a significantly inferior flatness.

Figure 16:
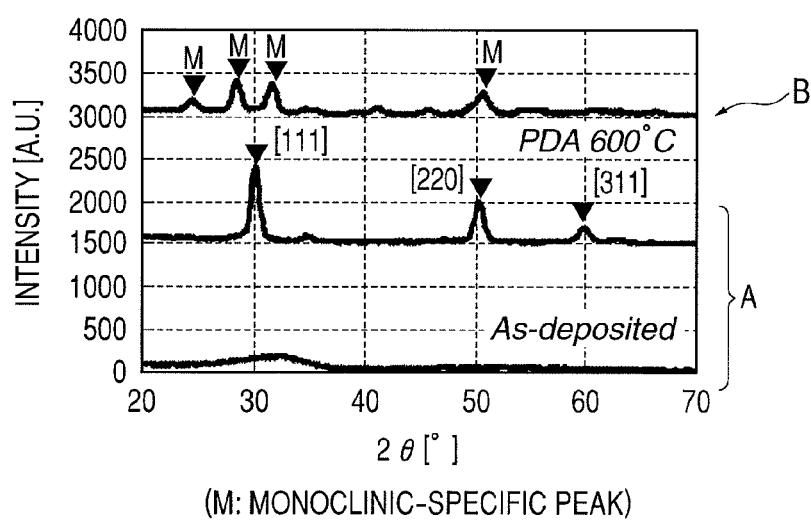
FIG. 16 is a diagram illustrating XRD spectrums of dielectric films.

FIG. 16 illustrates X-ray diffraction spectrums of $HfO_2$ formed under conditions A and B. In addition, an X-ray diffraction spectrum in the case of performing 600° C.-annealing treatment on the $HfO_2$ formed under condition A is illustrated in the diagram. Reference character M in the diagram indicates peaks that are specific to monoclinic crystals.

From FIG. 16, it is apparent that $HfO_2$ obtained under condition A is noncrystalline in an as-deposited state and crystallizes to a crystalline phase mainly consisting of cubical crystals by performing a 600° C. -annealing treatment. On the other hand, it is confirmed that the crystalline phase of $HfO_2$ obtained under condition B is monoclinic. A measurement of respective relative permittivity values (k) revealed that k=28 for the $HfO_2$ under condition A and k=17 for the $HfO_2$ under condition B. In addition, by forming $HfO_2$ under an oxygen flow rate condition (condition C) as indicated in FIG. 14 in which a mole fraction O/Hf of a dielectric film takes a value of 1.0, and evaluating electrical characteristics thereof, it is confirmed that leakage current values increase. Therefore, it is shown that, according to the present invention, in order to obtain a crystalline phase mainly consisting of cubical crystals having high relative permittivity, it is important that a mole fraction O/Hf in the film is set to a range of 1.0<O/Hf<2.0, formation is performed in a noncrystalline state, and crystallization into cubical crystals is subsequently realized by an annealing treatment.

A relationship among deposition conditions of a $HfO_2$ film not containing Al and N, mole fractions O/Hf, and deposition rates have been described above. However, it is confirmed that a high dielectric film can be obtained even under a deposition condition of a HfAlON film containing Al and N by forming a HfAlON film in a noncrystalline state by setting oxygen flow rate so that a mole fraction O/Hf falls within a range of 1.0<O/Hf<2.0 and subsequently crystallizing the HfAlON film into a crystalline structure mainly consisting of cubical crystals through an annealing treatment.

Figure 17:
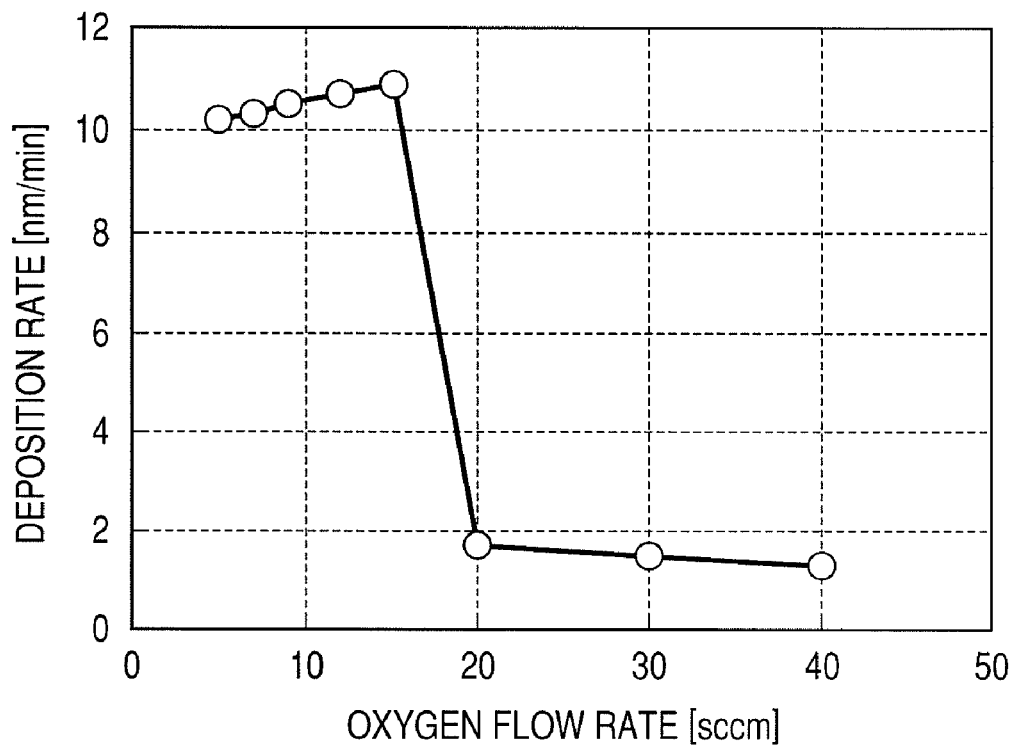
FIG. 17 is a diagram illustrating a relationship between deposition rate and oxygen supply during a deposition process of a dielectric film.

Next, FIG. 17 illustrates an oxygen flow rate dependency of deposition rates of a HfAlON film. From FIG. 17, it is confirmed that while the deposition rate is equal to or lower than 2 nm/min in a range where oxygen flow rate is equal to or exceeds 20 sccm, the deposition rate increases significantly to 10 nm/min or higher in an oxygen supply range equal to or lower than 20 sccm. This is because oxidation of the metallic target surface occurs when the oxygen supply is at 20 sccm and the sputtering rate decreases. Therefore, it is shown that in a case where a mole fraction O/Hf at which oxygen flow rate is at 20 sccm falls within a range of 1.0<O/Hf<2.0, the formation of a dielectric film according to the present invention can be realized without causing a reduction in the deposition rate.

Next, a relationship between in-plane uniformity of film thickness of a formed dielectric film and pressure in a vacuum container during film formation was studied. As a result, it is confirmed that a uniformity of ±1% or less is obtained in a region where the pressure inside the vacuum container is equal to or less than $1\times10^{-1}$ Pa.

In addition, while a case of using a HfAlON film in which the element A is Hf as a dielectric film has been described in the above embodiment, it is confirmed that similar effects can be achieved with a HfZrAlON film in which Zr is contained in Hf as the element A.

From the above, in order to manufacture a dielectric film whose relative permittivity value is equal to or greater than 40 and having heat resistance with respect to high-temperature annealing at 1000° C. as well as superior surface flatness requires that, with a metallic oxynitride containing an element A made of Hf or a mixture of Hf and Zr, an element B made of Al, and N and O: a mole fraction of the element A, the element B, and N expressed as B/(A+B+N) is set to a range of $0.015 \leq (B/(A+B+N)) \leq 0.095$, a mole fraction expressed as N/(A+B+N) is set to a range of $0.045 \leq (N/(A+B+N))$, and a mole fraction expressed as O/A is set to a range of 1.0<(O/A)<2.0; the metallic oxynitride is formed so as to have a noncrystalline structure; and, further, an annealing treatment at 700° C. or higher is performed on the metallic oxynitride having a noncrystalline structure to form a dielectric film including a crystalline phase mainly consisting of cubical crystals.

In addition, the step of forming a metallic oxynitride having a noncrystalline structure is preferably a step of performing magnetron sputtering on a metallic target making up the metallic oxynitride in a vacuum container in a mixed atmosphere made up of a reactive gas of a mixture gas of oxygen and nitrogen and an inert gas, and the supply of the reactive gas is preferably set such that a mole fraction O/A of the metallic oxynitride falls within a range of 1.0<(O/A)<2.0. Furthermore, for the purpose of suppressing a decrease in deposition rate, reactive gas supply is preferably set at or below a supply at which the rate of decrease in sputtering rate due to oxidation of the surface of the metallic target reaches maximum. Moreover, for the formed dielectric film to have a film thickness uniformity of ±1% or lower, the pressure inside the vacuum container during film formation is preferably set to $1\times10^{-1}$ Pa or lower.

While a case of forming a dielectric film on a silicon dioxide film has been described above, the arrangement is not restrictive, and sufficient effects can be obtained by applying the method according to the present invention to a blocking film of a MONOS non-volatile memory, an insulating film between a floating electrode and a gate electrode of an FG non-volatile memory element, or a portion of a MOS transistor.

More specifically, the method according to the present invention can be applied to methods of manufacturing a semiconductor device having a dielectric film as an insulating film including, but not limited to, the following manufacturing methods.

A method of manufacturing a semiconductor device according to an embodiment of the present invention is a method of manufacturing a non-volatile semiconductor device including: a substrate with at least a surface including a semiconductor layer; a gate electrode formed on the substrate; and a laminated gate insulating film sequentially laminated between the substrate and the gate electrode, wherein at least one layer among the insulating films that make up the laminated gate insulating film is formed by the method according to the present invention.

In addition, a method of manufacturing a semiconductor device according to another embodiment of the present invention is a non-volatile semiconductor device having a structure including: a substrate with at least a surface including a semiconductor layer; a gate electrode formed on the substrate; and an insulating film, a floating electrode, and an insulating film laminated in sequence between the substrate and the gate electrode, wherein at least a portion of the insulating films formed between the gate electrode and the floating electrode is formed by the method according to the present invention.

Furthermore, a method of manufacturing a semiconductor device according to yet another embodiment of the present invention is a method of manufacturing a semiconductor device having, on a substrate with at least a surface including a semiconductor layer, a source region, a drain region, and a gate electrode formed via an insulating film, wherein the insulating film is formed by the method according to the present invention.

In the present invention, when manufacturing a high dielectric film, it is important that, with respect to a dielectric film including a metallic oxynitride containing an element A being Hf (hafnium) or a mixture of Hf and Zr (zirconium), an element B being Al, and N and O: a mole fraction of the element A, the element B, and N and a mole fraction of the element A and O respectively fall within the specific ranges described above; the metallic oxynitride is formed so as to have a noncrystalline structure; and an annealing treatment at 700° C. or higher is performed on the metallic oxynitride having a noncrystalline structure. Therefore, the method according to the present invention described above can be applied to any device including a high dielectric film such as an MIS capacitor or a semiconductor device when forming the high dielectric film.

EXAMPLES

First Example

Example Using Cosputtering

A first example of the present invention will now be described in detail with reference to the drawings.

Figure 18:
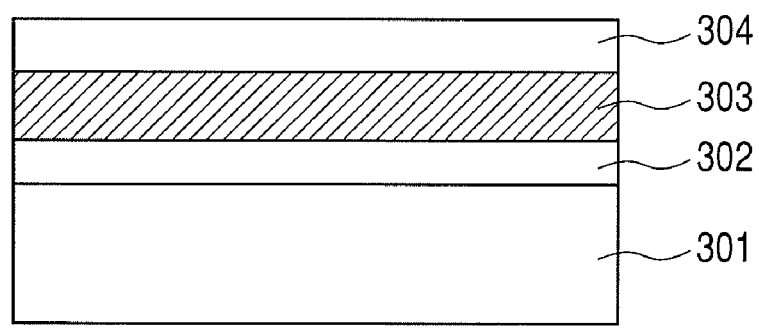
FIG. 18 is a cross-sectional view of an MIS capacitor according to a first example.

FIG. 18 is a diagram illustrating an MIS capacitor having a dielectric film formed by the method according to the present invention. A substrate processing apparatus according to the present example such as that illustrated in FIG. 2 deposited a HfAlON film 303 having a noncrystalline structure by a sputtering method on a silicon substrate 301 having, on a surface thereof, a silicon dioxide film 302 with a film thickness ranging from 3 nm to 5 nm. Metallic targets of Hf and Al were used as the targets 106 and 126. Argon, oxygen, and nitrogen were used as sputtering gases.

A substrate temperature can be arbitrarily set within a range of 27° C. to 600° C., a target power to within a range of 50 W to 1000 W, a sputter gas pressure to within a range of 0.02 Pa to 0.1 Pa, an Ar gas flow rate to within a range of 1 sccm to 200 sccm, an oxygen gas flow rate to within a range of 1 sccm to 100 sccm, and a nitrogen gas flow rate to within a range of 1 sccm to 50 sccm.

In this case, the substrate processing apparatus according to the present example performed film formation by controlling the heater 105 so as to set the substrate temperature to 30° C., controlling the direct current power supply 110 so as to set Hf target power to 600 W, controlling the direct current power supply 130 so as to set Al target power to within a range of 50 W to 500 W, controlling the exhaust pump 118 and the like so as to set sputtering gas pressure to 0.03 Pa, controlling the mass flow controller 230 so as to set Ar gas flow rate to 25 sccm, and controlling the mass flow controller 211 so as to set nitrogen gas flow rate to within a range of 0 to 20 sccm. In addition, in order to deposit a HfAlON film having a noncrystalline structure, the substrate processing apparatus according to the present example controlled the mass flow controller 207 to set oxygen supply so that the mole fraction O/A illustrated in FIG. 14 fell within a range of $1.0<(O/A)<2.0$.

Using the formation process described above, a HfAlON film with an Al mole fraction with a range of $0.015 \leq Al/(Hf+Al+N) \leq 0.095$, a N mole fraction with a range of $0.045 \leq N/(Hf+Al+N)$, and a mole fraction of Hf and O with a range of $1.0<O/Hf<2.0$ was formed to a film thickness of 5 nm to 25 nm.

Next, a TiN film 304 with a film thickness of 10 nm was deposited by using a sputtering method on the HfAlON film. A metallic target of Ti was used as a target. Argon and nitrogen were used as sputter gases. For example, the substrate processing apparatus according to the present example includes a second film formation processing chamber separate from the film formation processing chamber 100, and also includes, in the second film formation processing chamber, a supplying mechanism that supplies a Ti target and a sputter gas into the second film formation processing chamber. The substrate processing apparatus according to the present example includes a physical vapor deposition mechanism for performing physical vapor deposition such as sputtering using a Ti target.

A substrate temperature can be arbitrarily set within a range of 27° C. to 600° C., a target power to within a range of 50 W to 1000 W, a sputter gas pressure to within a range of 0.02 Pa to 0.1 Pa, an Ar gas flow rate to within a range of 1 sccm to 200 sccm, and a nitrogen gas flow rate to within a range of 1 sccm to 50 sccm.

In the example, the physical vapor deposition mechanism was controlled so as to perform film formation at a substrate temperature of 30° C., a Ti target power of 750 W, a sputter gas pressure of 0.03 Pa, an Ar gas flow rate of 30 sccm, and a nitrogen gas flow rate of 10 sccm.

Moreover, while the TiN film 304 was deposited in this example, Ti, TaN, W, Pt, Ru, Al, and Si can also be used as appropriate. Alternatively, a film selected from among a group made up of these elements may be deposited.

Next, the substrate processing apparatus according to the present example performed an annealing treatment in a nitrogen atmosphere either at 700° C. for 2 minutes or at 1000° C. for 10 seconds to crystallize the HfAlON film so as to obtain the dielectric film 303. In this case, while annealing treatment has been performed after depositing the TiN film 304, annealing treatment may alternatively be performed before depositing the TiN film 304. In addition, in this case, although annealing treatment has been performed in a nitrogen atmosphere, an oxygen or an inert gas such as Ar can be used as appropriate. Alternatively, annealing may be performed in an atmosphere selected from among a group made up of these gases. In other words, the substrate processing apparatus according to the present example includes an annealing treatment mechanism for applying an annealing treatment to a substrate. In addition, the substrate processing apparatus according to the present example can separately include a chamber for the annealing treatment.

Next, the TiN film 304 was processed to a desired size using a lithographic technique and an RIE technique to form an MIS capacitor structure.

A relative permittivity of the dielectric film 303 fabricated as described above was evaluated. As a result, it is confirmed that a relative permittivity value of 40 or greater is attained when the Al mole fraction Al/(Hf+Al+N) of a HfAlON film ranges from 0.015 to 0.095, inclusive, and the N mole fraction N/(Hf+Al+N) thereof is equal to or greater than 0.045. In addition, by measuring an X-ray diffraction of the dielectric film 303 subjected to an annealing treatment at 700° C. or higher, it is confirmed that the dielectric film 303 has a crystalline structure mainly consisting of cubical crystals. Furthermore, an AFM evaluation of the surface flatness revealed that superior surface flatness is achieved in comparison with a $HfO_2$ film and a HfON film not containing Al and N.

As shown, according to the present example, it is confirmed that by implementing: a step of forming a metallic oxynitride expressed as HfAlON (having an Al mole fraction of $0.015 \leq (Al/(Hf+Al+N)) \leq 0.095$ and an N mole fraction of $0.045 \leq (N/(Hf+Al+N))$) and having a noncrystalline structure; and a step of performing an annealing treatment at 700° C. or higher on the metallic oxynitride having a noncrystalline structure to form a metallic oxynitride including a crystalline phase mainly consisting of cubical crystals, a high dielectric film with a relative permittivity value of 40 or higher and having heat resistance with respect to a high-temperature annealing process of 1000° C. and superior surface flatness can be obtained.

In addition, according to the present example, it is confirmed that similar effects can be obtained even when HfZrAlON containing Hf and Zr as the element A is used as the dielectric film 303.

Moreover, it is confirmed that a similar effect can also be achieved with a structure in which the TiN film 304 is not deposited on the dielectric film 303.

Furthermore, it is confirmed that a similar effect can also be achieved by using a material selected from among a group made up of Ti, TaN, W, Pt, Ru, Al and Si instead of the TiN film 304.

Second Example

Example Applied to Gate Insulating Film

A second example of the present invention will now be described in detail with reference to the drawings.

Figure 19:
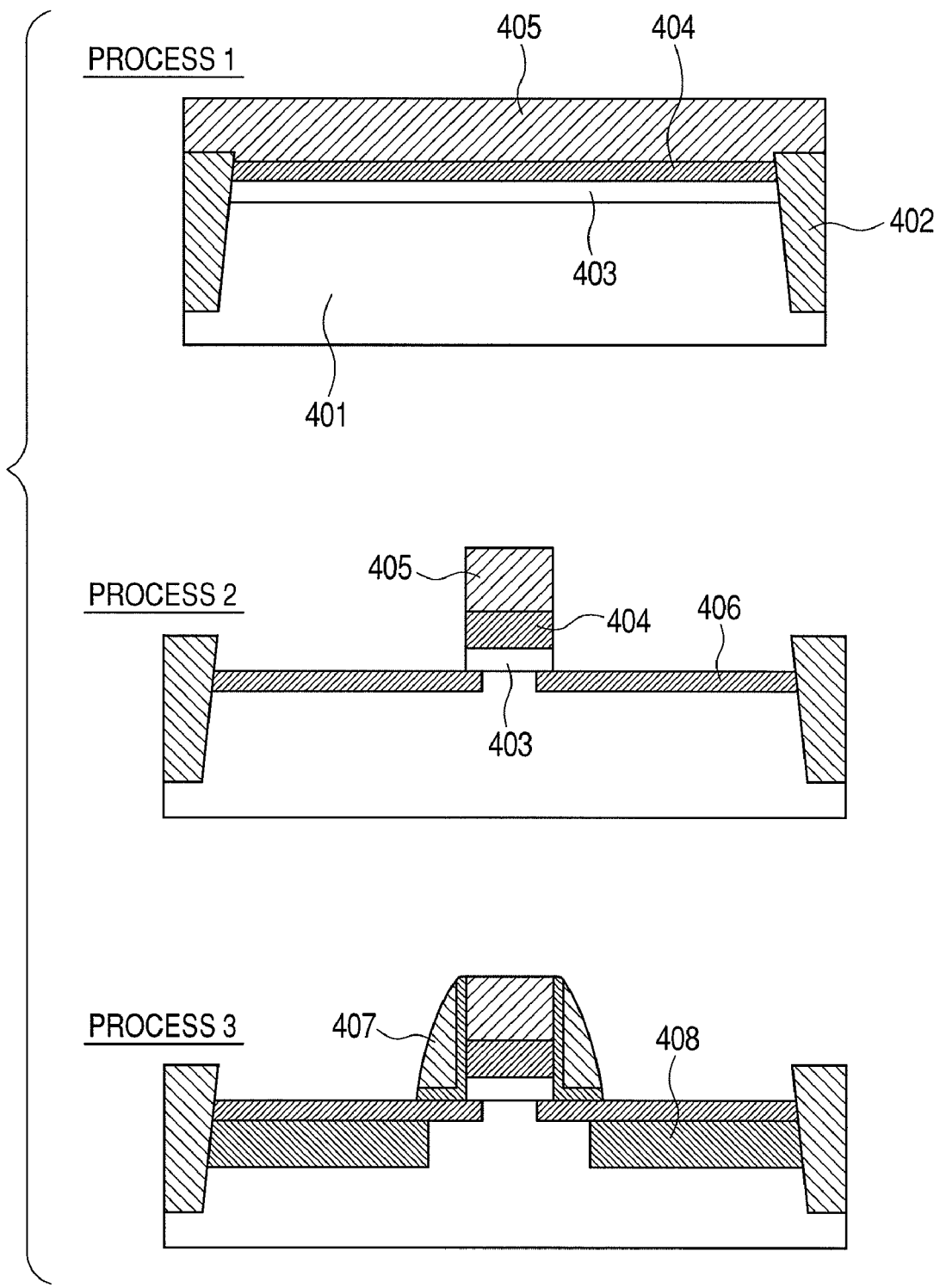
FIG. 19 is a diagram illustrating processes of a semiconductor device manufacturing method according to a second example.

FIG. 19 is a diagram illustrating processes of a semiconductor device manufacturing method according to a second example of the present invention.

First, as depicted by process 1 in FIG. 19, a substrate processing apparatus according to the present example forms an element isolation region 402 on a surface of a silicon substrate 401 using a STI (shallow trench isolation) technique. The substrate processing apparatus according to the present example then forms a silicon dioxide film 403 with a film thickness of 1.8 nm on the element-isolated surface of the silicon substrate 401 using a thermal oxidation method. Subsequently, the substrate processing apparatus according to the present example forms a HfAlON film with a film thickness ranging from 1 nm to 10 nm using the same method as the first example. Next, the substrate processing apparatus according to the present example performed an annealing treatment in a nitrogen atmosphere at 1000° C. for 10 seconds to crystallize the HfAlON film so as to obtain the dielectric film 404.

Subsequently, the substrate processing apparatus according to the present example first forms a poly-Si 405 with a thickness of 150 nm on the dielectric film 404, processes a gate electrode using a lithographic technique and an RIE technique as depicted by process 2 in FIG. 19, and then performs ion implantation to self-aligningly form an extension region 406 using the gate electrode as a mask.

Furthermore, as depicted by process 3 in FIG. 19, the substrate processing apparatus according to the present example sequentially deposits a silicon nitride film and a silicon dioxide film, and subsequently performs etch-back to form a gate sidewall 407. The substrate processing apparatus according to the present example once again performs ion implantation in this state, and forms a source-drain region 408 through active annealing. Moreover, the crystallization of the HfAlON film may be performed by an active annealing process. In this case, an crystallization annealing process following deposition of the HfAlON film can be omitted.

An evaluation of the electrical characteristics of the fabricated semiconductor device revealed that with a HfAlON film that is the dielectric film 404 whose Al mole fraction is within a range of $0.015 \leq Al/(Hf+Al+N) \leq 0.095$ and whose N mole fraction is within a range of $0.045 \leq N/(Hf+Al+N)$, relative permittivity increases in comparison with a $HfO_2$ film not containing Al and N and leakage current can be reduced. In addition, by measuring an X-ray diffraction of the dielectric film 404 subjected to an annealing treatment, it is confirmed that the dielectric film 404 has a crystalline structure mainly consisting of cubical crystals.

As shown, according to the present example, by implementing the method of manufacturing a dielectric film according to the present invention in a method of manufacturing a semiconductor device including a HfAlON film in a portion of a MOSFET gate insulating film, a semiconductor device capable of reducing gate leakage current can be obtained. Moreover, according to the present example, it is confirmed that a similar effect can also be achieved when a HfZrAlON film containing Zr is used as a dielectric film.

Third Example

Example Applied to Blocking Film of Non-Volatile Memory Element

Figure 20:
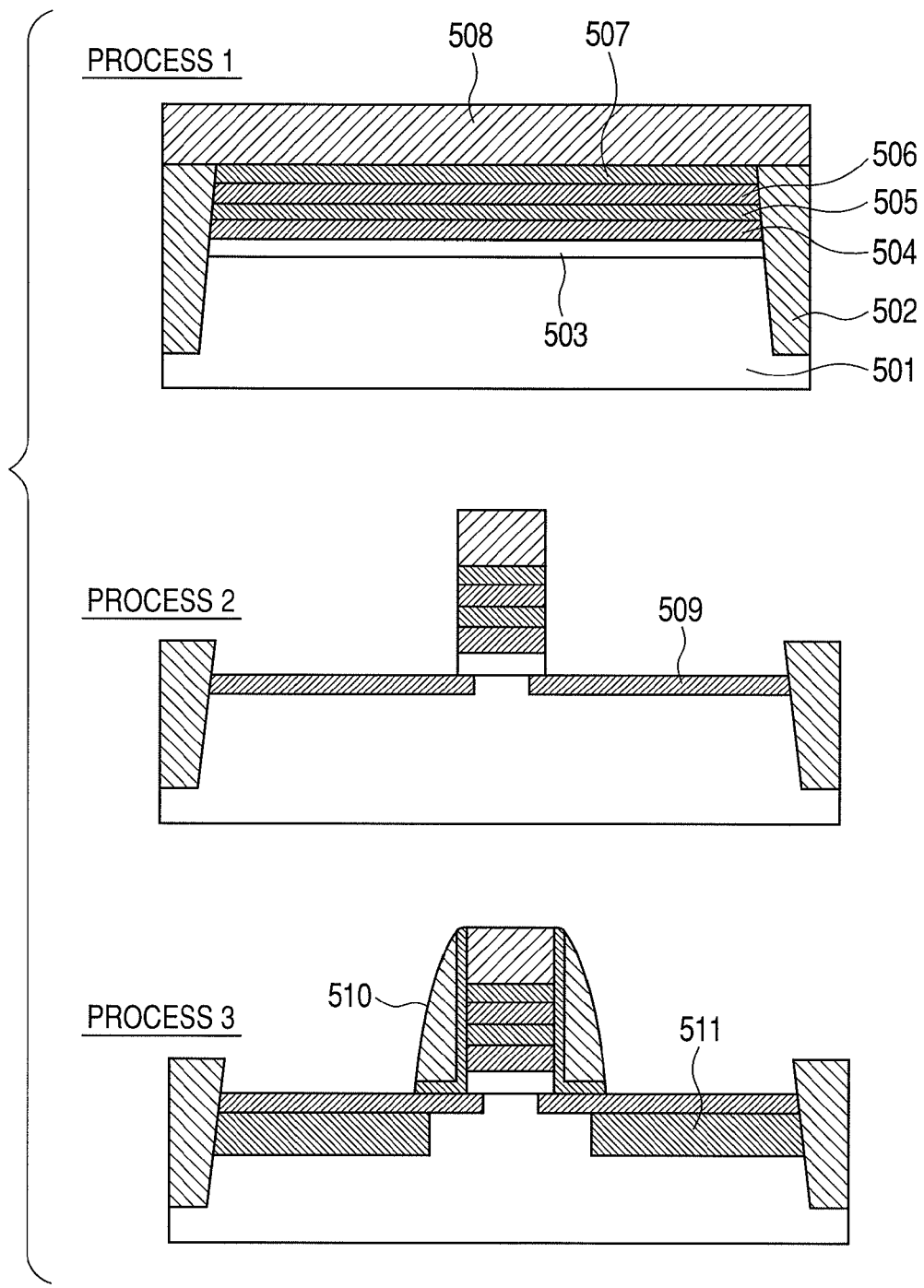
FIG. 20 is a diagram illustrating processes of a semiconductor device manufacturing method according to a third example.

FIG. 20 is a cross-sectional diagram illustrating fabricating processes of a semiconductor element according to a third example of the present invention.

First, as depicted by process 1 in FIG. 20, a substrate processing apparatus according to the present example forms an element isolation region 502 on a surface of a silicon substrate 501 using a STI (shallow trench isolation) technique. The substrate processing apparatus according to the present example then forms a silicon dioxide film as a first insulating film 503 to 30 Å to 100 Å on the element-isolated surface of the silicon substrate 501 using a thermal oxidation method. Subsequently, the substrate processing apparatus according to the present example forms a silicon nitride film as a second insulating film 504 to 30 Å to 100 Å using an LPCVD (low pressure chemical vapor deposition) method. Next, the substrate processing apparatus according to the present example forms an aluminum oxide film as a third insulating film 505 to 5 Å to 50 Å. For the aluminum oxide layer, an MOCVD method, an ALD (atomic layer deposition) method, or a PVD (physical vapor deposition) method may be used. Subsequently, the substrate processing apparatus according to the present example forms a HfAlON film with a film thickness ranging from 5 nm to 20 nm as a fourth insulating film 506 using the same method as the first example. Next, the substrate processing apparatus according to the present example forms an aluminum oxide film as a fifth insulating film 507 to 5 Å to 50 Å. An MOCVD method, an ALD method, or a PVD method may be used as a forming method.

Subsequently, the substrate processing apparatus according to the present example first forms a poly-Si film with a thickness of 150 nm as a gate electrode 508, processes a gate electrode using a lithographic technique and an RIE (reactive ion etching) technique as depicted by process 2 in FIG. 20, and then performs ion implantation to self-aligningly form an extension region 509 using the gate electrode as a mask.

Furthermore, as depicted by process 3 in FIG. 20, the substrate processing apparatus according to the present example sequentially deposits a silicon nitride film and a silicon dioxide film, and subsequently performs etch-back to form a gate sidewall 510. The substrate processing apparatus according to the present example once again performs ion implantation in this state, and forms a source-drain region 511 through active annealing.

An evaluation of the electrical characteristics of the fabricated semiconductor device revealed that with a HfAlON film that is the fourth insulating film 506 whose Al mole fraction is within a range of $0.015 \leq Al/(Hf+Al+N) \leq 0.095$ and whose N mole fraction is within a range of $0.045 \leq N/(Hf+Al+N)$, relative permittivity increases in comparison with a $HfO_2$ film not containing Al and N and leakage current can be reduced. In addition, by measuring an X-ray diffraction of the fourth insulating film 506 subjected to an annealing treatment, it is confirmed that the fourth insulating film 506 has a crystalline structure mainly consisting of cubical crystals.

As shown, according to the present example, by implementing the method of manufacturing a dielectric film according to the present invention in a method of manufacturing a semiconductor device including a HfAlON film in a portion of a blocking insulating film of a MONOS non-volatile memory element, a semiconductor device capable of reducing gate leakage current can be obtained. Moreover, according to the present example, it is confirmed that a similar effect can also be achieved when a HfZrAlON film containing Zr is used as a dielectric film.

Moreover, while a poly-Si film has been used as the gate electrode in the present example, the same effects were achieved when using TiN, TaN, W, WN, Pt, Ir, Pt, Ta, or Ti as the gate electrode.

In addition, while annealing treatments of the first insulating film 503, the second insulating film 504, the third insulating film 505, the fourth insulating film 506, and the fifth insulating film 507 were performed by active annealing after ion implantation in the present example, annealing treatments may alternatively be performed after forming the respective insulating films.

Furthermore, while a laminated film made up of the third insulating film 505, the fourth insulating film 506, and the fifth insulating film 507 was used in the present example as a blocking layer of a non-volatile semiconductor memory element, the same effects were achieved using a laminated film made up of the third insulating film 505 and the fourth insulating film 506.

Fourth Example

Example Applied to FG Non-volatile Semiconductor Element

A fourth example of the present invention will now be described in detail with reference to the drawings.

Figure 21:
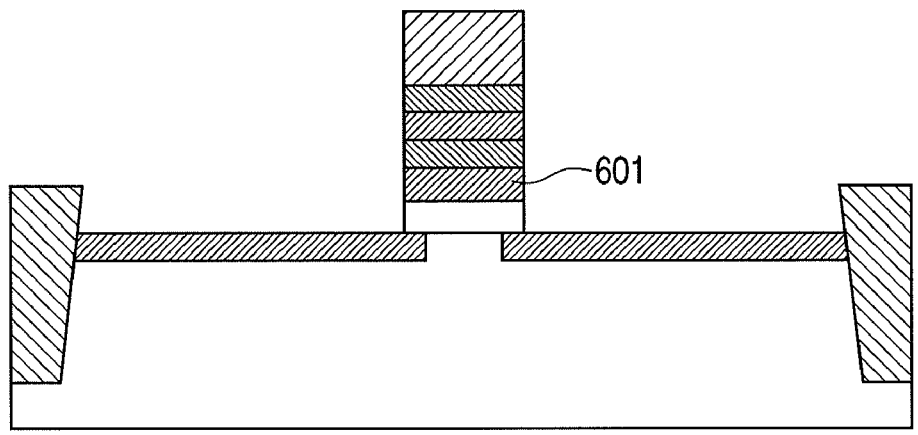
FIG. 21 is a cross-sectional view of a semiconductor device according to a fourth example.

FIG. 21 is a cross-sectional diagram of a semiconductor device according to a fourth example of the present invention. The present example differs from the third example in that the second insulating film 504 of a semiconductor element in the third example is to be now formed of a layer made of poly-Si 601. Forming processes subsequent to the second insulating film 504 are the same as the third example.

An evaluation of the electrical characteristics of the fabricated semiconductor device revealed that with a HfAlON film that is the fourth insulating film whose Al mole fraction is within a range of $0.015 \leq Al/(Hf+Al+N) \leq 0.095$ and whose N mole fraction is within a range of $0.045 \leq N/(Hf+Al+N)$, relative permittivity increases in comparison with a $HfO_2$ film not containing Al and N and leakage current can be reduced. In addition, by measuring an X-ray diffraction of the fourth insulating film subjected to an annealing treatment, it is confirmed that the fourth insulating film has a crystalline structure mainly consisting of cubical crystals.

As shown, according to the present example, by implementing the method of manufacturing a dielectric film according to the present invention in a method of manufacturing a semiconductor device including a HfAlON film in a portion of a blocking insulating film (interpoly insulating film) of an FG non-volatile memory element having a floating electrode, a semiconductor device capable of reducing gate leakage current can be obtained. Moreover, according to the present example, it is confirmed that a similar effect can also be achieved when a HfZrAlON film containing Zr is used as a dielectric film.

Moreover, while a poly-Si film has been used as a gate electrode in the present example, the same effects were achieved when using TiN, TaN, W, WN, Pt, Ir, Pt, Ta, or Ti as the gate electrode.

In addition, while annealing treatments of the first insulating film, the second poly-Si layer, the third insulating film, the fourth insulating film, and the fifth insulating film were performed by active annealing after ion implantation in the present example, annealing treatments may alternatively be performed after forming the respective insulating films.

Furthermore, while a laminated film made up of the third insulating film, the fourth insulating film, and the fifth insulating film was used in the present example as a blocking layer of a non-volatile semiconductor memory element, the same effects were achieved using a laminated film made up of the third insulating film and the fourth insulating film.

Figure 22:
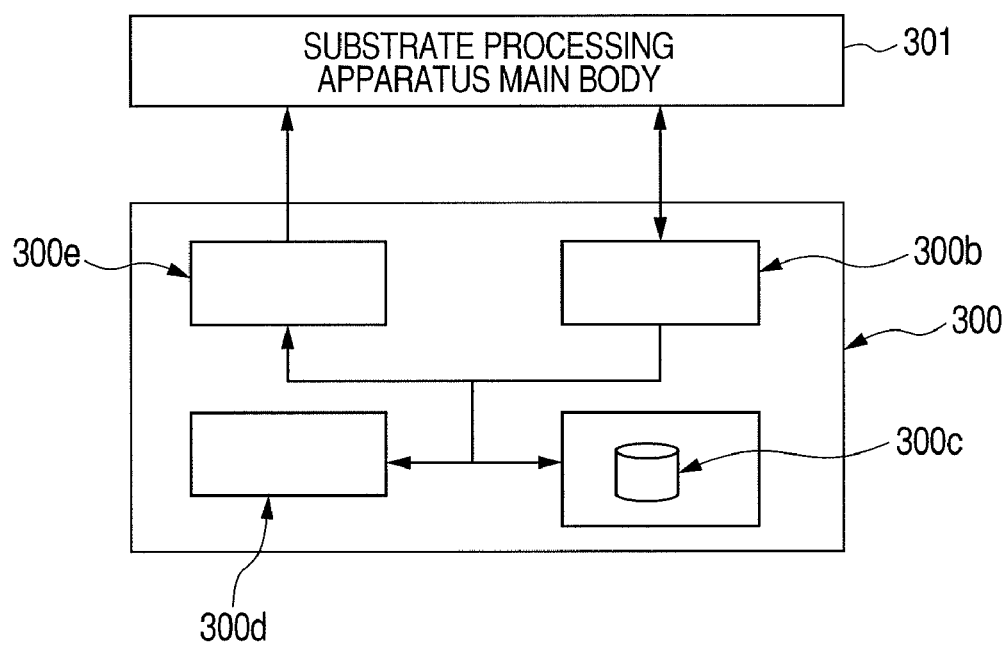
FIG. 22 is a schematic diagram illustrating a control mechanism for implementing the first to fourth examples.

FIG. 22 is a schematic diagram illustrating a control mechanism for implementing the first to fourth examples. A control mechanism 300 is connected to a substrate processing apparatus 301 capable of implementing the first to fourth examples. The control mechanism 300 includes an input unit 300b, a storage unit 300c having a program and data, a processor 300d, and an output unit 300e. The control mechanism 300 basically has a computer configuration and controls the substrate processing apparatus 301.

In FIG. 22, the substrate processing apparatus 301 can be used as the substrate processing apparatuses according to the first to fourth examples described above. Therefore, the control mechanism 300 can control operations of the substrate processing apparatus 301 by having the processor 300d execute a control program stored in the storage unit 300c. In other words, under the control of the control mechanism 300, the substrate processing apparatus 301 is capable of performing the operations described in the first to sixth examples above.

The control mechanism 300 may be provided separately from the substrate processing apparatus 301 or may be incorporated into the substrate processing apparatus 301.

It is to be understood that a processing method which causes: a storage medium to store a program that causes a configuration of the aforementioned embodiments to be operated so as to realize the functions of the aforementioned embodiments; reads out the program stored in the storage medium as a code; and executes the program on a computer is also included in the scope of the aforementioned embodiments. In other words, a computer-readable storage medium is also included in the scope of the embodiments. Furthermore, in addition to a storage medium storing the computer program described above, the computer program itself is also included in the scope of the aforementioned embodiments.

For example, a floppy (registered trademark) disk, a hard disk, an optical disk, a magnetooptic disk, a CD-ROM, a magnetic tape, a non-volatile memory card, and a ROM can be used as the storage medium.

Moreover, in addition to an arrangement in which processing is single-handedly executed by a program stored in the storage medium described above, an arrangement in which the program runs on an OS in cooperation with functions of other software and expansion boards to execute the operations of the aforementioned embodiments is also included in the scope of the aforementioned embodiments.

The invention claimed is:

1. A method of manufacturing a dielectric film including a metallic oxynitride containing an element A being Hf or a mixture of Hf and Zr, an element B being Al, and N and O, the manufacturing method comprising:

a step of forming a metallic oxynitride whose mole fraction of the element A, the element B, and N expressed as B/(A+B+N) has a range of $0.015 \leqq (B/(A+B+N)) \leqq 0.095$ and mole fraction of the element A, element B, and N expressed as N/(A+B+N) has a range of $0.045 \leqq (N/(A+B+N))$ and whose mole fraction of the element A and O expressed as O/A has a range of $1.0<(O/A)<2.0$, and having a noncrystalline structure; and a step of performing an annealing treatment at 700° C. or higher on the metallic oxynitride having a noncrystalline structure to form a metallic oxynitride including a crystalline phase with a cubical crystal incorporation percentage of 80% or higher.

2. The method of manufacturing a dielectric film according to claim 1, wherein the step of forming the metallic oxynitride having a noncrystalline structure is a step of performing magnetron sputtering on a metallic target making up the metallic oxynitride in a vacuum container in a mixed atmosphere made up of a reactive gas of a mixture gas of oxygen and nitrogen and an inert gas, and the supply of the reactive gas is set such that mole fraction O/A of the element A and O of the metallic oxynitride falls within a range of $1.0<(O/A)<2.0$.

3. The method of manufacturing a dielectric film according to claim 2, wherein the reactive gas supply is set at or below a supply at which the rate of decrease in sputtering rate due to oxidation of the surface of the metallic target reaches maximum.

4. The method of manufacturing a dielectric film according to claim 2, wherein the pressure inside the vacuum container is set to $1 \times 10^{-1}$ Pa or lower.

5. The method of manufacturing a dielectric film according to claim 1, wherein a relative permittivity of the dielectric film is equal to or greater than 40.

6. A method of manufacturing a semiconductor device having a dielectric film as an insulating film, wherein
the dielectric film is formed by the method according to claim 1.

7. A method of manufacturing a non-volatile semiconductor device comprising:
a substrate with at least a surface including a semiconductor layer;
a gate electrode formed on the substrate; and
a laminated gate insulating film sequentially laminated between the substrate and the gate electrode, wherein
at least one layer among the insulating films that make up the laminated gate insulating film is formed by the method according to claim 1.

8. A method of manufacturing a non-volatile semiconductor device comprising:
a substrate with at least a surface including a semiconductor layer;
a gate electrode formed on the substrate; and
a structure in which an insulating film, a floating electrode, and an insulating film are laminated in sequence between the substrate and the gate electrode, wherein
at least a portion of the insulating films formed between the gate electrode and the floating electrode is formed by the method according to claim 1.

9. A method of manufacturing a semiconductor device having,
on a substrate with at least a surface including a semiconductor layer,
a source region,
a drain region, and
a gate electrode formed via an insulating film, wherein
the insulating film is formed by the method according to claim 1.

* * * * *